United States Patent
McFeely et al.

(10) Patent No.: US 7,964,497 B2
(45) Date of Patent: Jun. 21, 2011

(54) STRUCTURE TO FACILITATE PLATING INTO HIGH ASPECT RATIO VIAS

(75) Inventors: Fenton R. McFeely, Ossining, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 55 days.

(21) Appl. No.: 12/163,172

(22) Filed: Jun. 27, 2008

(65) Prior Publication Data
US 2009/0321933 A1   Dec. 31, 2009

(51) Int. Cl.
*H01L 21/4763* (2006.01)
*H01L 21/44* (2006.01)

(52) U.S. Cl. ........ 438/627; 438/643; 438/653; 438/687; 257/E21.584

(58) Field of Classification Search .............. 438/627, 438/643, 653, 687; 257/E21.584
See application file for complete search history.

(56) References Cited

U.S. PATENT DOCUMENTS

| | | | |
|---|---|---|---|
| 6,069,073 A | 5/2000 | Kim et al. | |
| 6,403,491 B1 * | 6/2002 | Liu et al. | 438/710 |
| 6,790,773 B1 | 9/2004 | Drewery et al. | |
| 6,989,599 B1 | 1/2006 | Iwasaki et al. | |
| 7,253,103 B2 | 8/2007 | Iwasaki et al. | |
| 2001/0033023 A1 * | 10/2001 | Suguro | 257/751 |
| 2004/0135255 A1 * | 7/2004 | Matsunaga et al. | 257/758 |
| 2004/0175921 A1 * | 9/2004 | Cowley et al. | 438/622 |
| 2005/0095846 A1 | 5/2005 | Basol | |
| 2005/0181598 A1 * | 8/2005 | Kailasam | 438/654 |
| 2006/0121733 A1 | 6/2006 | Kilpela et al. | |
| 2006/0193372 A1 | 8/2006 | McCorkle et al. | |
| 2006/0199372 A1 * | 9/2006 | Chung et al. | 438/628 |
| 2007/0062817 A1 | 3/2007 | Monchoix et al. | |
| 2007/0190780 A1 * | 8/2007 | Chung et al. | 438/675 |
| 2007/0205510 A1 | 9/2007 | Lavoie et al. | |
| 2007/0238288 A1 | 10/2007 | Suzuki | |
| 2007/0273042 A1 | 11/2007 | Kuhn et al. | |

FOREIGN PATENT DOCUMENTS

| | | |
|---|---|---|
| JP | 2002-075994 | 3/2002 |
| JP | 2008-041700 | 2/2008 |
| WO | WO 2006/057706 A2 | 6/2006 |
| WO | WO 2006/057708 A2 | 6/2006 |
| WO | WO 2006/104853 | 10/2006 |

OTHER PUBLICATIONS

Japan Office Action dated Sep. 3, 2009.
Extended European Search Report dated Jun. 2, 2009.
Japan Office Action dated Oct. 30, 2009.

* cited by examiner

*Primary Examiner* — Lex Malsawma
(74) *Attorney, Agent, or Firm* — Shimokaji & Associates, P.C.

(57) ABSTRACT

Improved high aspect ratio vias and techniques for the formation thereof are provided. In one aspect, a method of fabricating a copper plated high aspect ratio via is provided. The method comprises the following steps. A high aspect ratio via is etched in a dielectric layer. A diffusion barrier layer is deposited into the high aspect ratio via and over one or more surfaces of the dielectric layer. A copper layer is deposited over the diffusion barrier layer. A ruthenium layer is deposited over the copper layer. The high aspect ratio via is filled with copper plated onto the ruthenium layer. A copper plated high aspect ratio via formed by this method is also provided.

15 Claims, 3 Drawing Sheets

STRUCTURE TO FACILITATE PLATING INTO HIGH ASPECT RATIO VIAS

FIELD OF THE INVENTION

The present invention relates to semiconductor interconnect structures and more particularly, to improved high aspect ratio vias and techniques for the formation thereof.

BACKGROUND OF THE INVENTION

As the dimensions of multilayer wiring array features continue to shrink, the fabrication of vias is becoming increasingly more difficult. Namely, conventional via fabrication processes are unable to keep up with currently desirable scaled feature sizes. FIGS. 1A-C, for example, illustrate common problems associated with conventional via fabrication processes, when smaller feature sizes (e.g., 45 nanometer (nm) node or smaller technology) are involved. As shown in FIG. 1A, dielectric layer 120 is deposited over substrate 100, and via 101 is etched into dielectric layer 120. As shown in FIG. 1B, via 101/surface of dielectric 120 are lined with diffusion barrier layer 130. The diffusion barrier layer can be tantalum nitride (TaN), or any other suitable diffusion barrier material. Electroplating is used to fill via 101 with copper (Cu). However, in order to perform the electroplating, it is first necessary to deposit a seed layer onto which the Cu can be subsequently plated. Namely, as shown in FIG. 1C, seed layer 140 is formed by sputter depositing Cu onto diffusion barrier layer 130.

A problem with this approach is that, as the via width shrinks to below about 80 nm and the aspect (depth/width) ratio becomes larger than about 5:1, the electroplating of the structure begins to fail. As shown in FIG. 1C, there is a substantial non-uniformity of the Cu thickness in seed layer 140. This non-uniformity is a consequence of the directional nature of the sputter deposition process coupled with the fact that a layer of Cu having a sufficient thickness so as to be continuous is required on the via bottom/sidewalls to ensure that there are no spots that cannot be plated. As a result, an excess amount of Cu is deposited on horizontal surfaces of the via. This excess Cu ends up overhanging the via opening. As a result, when electroplating is attempted this overhang occludes the via opening and causes the via opening to close off leaving an unfilled void within in the via, which is a catastrophic fault.

In an attempt to prevent the above-described overhang occlusion problem, an alternative approach has been devised where instead of sputter depositing a Cu seed layer onto the diffusion barrier layer, a ruthenium (Ru) seed layer is deposited onto the diffusion barrier layer by chemical vapor deposition (CVD), i.e., from a ruthenium carbonyl ($Ru_3(CO)_{12}$) precursor in the presence of excess CO. A Ru seed layer produced in this manner can be conformally deposited and thus does not create a thick overhanging layer, which greatly reduces the problem of void formation in the subsequent Cu electroplating step.

Use of a Ru seed layer, however, has significant drawbacks that arise from the relatively high resistivity of Ru compared to Cu and the chemical inertness of Ru. For example, following electroplating chemical-mechanical polishing (CMP) is typically used to plane the via metal down to the dielectric surface. As a practical matter, five nm is an approximate upper limit for the amount of Ru which can be polished away using a standard Cu polishing slurry. However, the bulk resistivity of Ru is more than four times higher than that of Cu. If only five nm of Ru are deposited, the resistivity of the resulting structure renders electroplating extremely difficult, as voltage drops across the wafer cause unacceptable non-uniformity in the Cu deposition. One could increase the conductivity of the substrate by depositing a thicker layer of Ru, and alleviate this problem, but then the subsequent CMP process would not be possible. One is left with a choice of problems, if the Ru is thick enough to make plating easy, subsequent CMP is not possible with the standard Cu polishing slurry. If the Ru layer is thinned to the point where CMP becomes possible, the substrate is too resistive for uniform plating using standard techniques. Furthermore, even if a method is developed to polish thicker layers of Ru, it would not be a desirable solution. The additional Ru added to facilitate the electroplating process would remain in the vias after CMP, which would reduce the volume available in the vias for Cu, and the resistance of the vias would be significantly increased, degrading performance.

Thus, improved via fabrication processes are needed that can accommodate the most current scaled technology requirements and can consistently produce properly functioning, viable vias.

SUMMARY OF THE INVENTION

The present invention provides improved high aspect ratio vias and techniques for the formation thereof. In one aspect of the invention, a method of fabricating a copper plated high aspect ratio via is provided. The method comprises the following steps. A high aspect ratio via is etched in a dielectric layer. A diffusion barrier layer is deposited into the high aspect ratio via and over one or more surfaces of the dielectric layer. A copper layer is deposited over the diffusion barrier layer. A ruthenium layer is deposited over the copper layer. The high aspect ratio via is filled with copper plated onto the ruthenium layer.

In another aspect of the invention, a copper plated high aspect ratio via formed in a dielectric layer is provided. The copper plated high aspect ratio via comprises a high aspect ratio via; a diffusion barrier layer lining the high aspect ratio via and one or more surfaces of the dielectric layer; a copper layer over the diffusion barrier layer; a ruthenium layer over the copper layer; and copper plated onto the ruthenium layer filling the high aspect ratio via to form the copper plated high aspect ratio via.

A more complete understanding of the present invention, as well as further features and advantages of the present invention, will be obtained by reference to the following detailed description and drawings.

DETAILED DESCRIPTION OF PREFERRED EMBODIMENTS

Figure 2A:
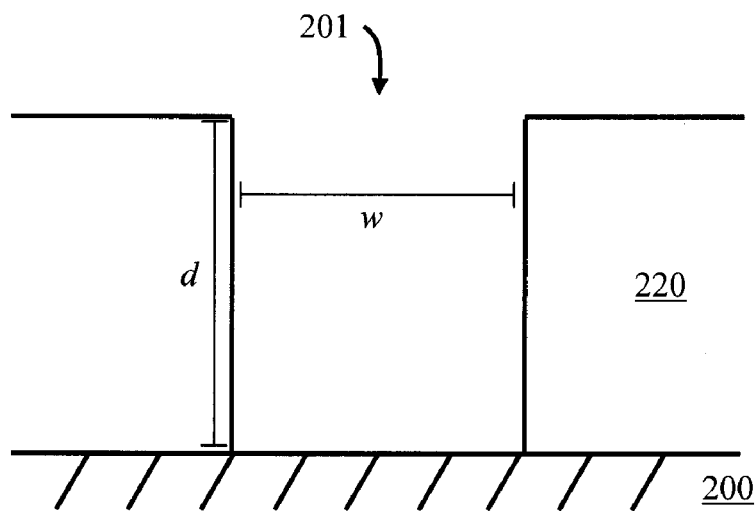
FIGS. 2A-D are cross-sectional diagrams illustrating an exemplary via fabrication process according to an embodiment of the present invention.

FIGS. 2A-D are cross-sectional diagrams illustrating an exemplary via fabrication process. As shown in FIG. 2A, dielectric layer 220 is deposited over substrate 200. Dielectric layer 220 can comprise any suitable dielectric material, including, but not limited to, one or more of silicon dioxide ($SiO_2$), silicon-carbon-oxygen-hydrogen materials (e.g., SICOH) and organic polymers, and can be deposited using any suitable deposition process, such as chemical vapor deposition (CVD), atomic layer deposition (ALD), evaporation, sputtering or solution based techniques, such as spin-on coating, to a thickness of from about 10 nanometers (nm) to about 1,000 nm. Substrate 200 generally represents any wiring or contact layer in a single or multilayer wiring array. High aspect ratio via 201 is then etched into dielectric layer 220, using any suitable etching process, such as reactive ion etching (RIE). According to one exemplary embodiment, high aspect ratio via 201 is etched into dielectric layer 220 using RIE and has a depth d/width w aspect ratio of greater than or equal to about 5:1.

Figure 2B:
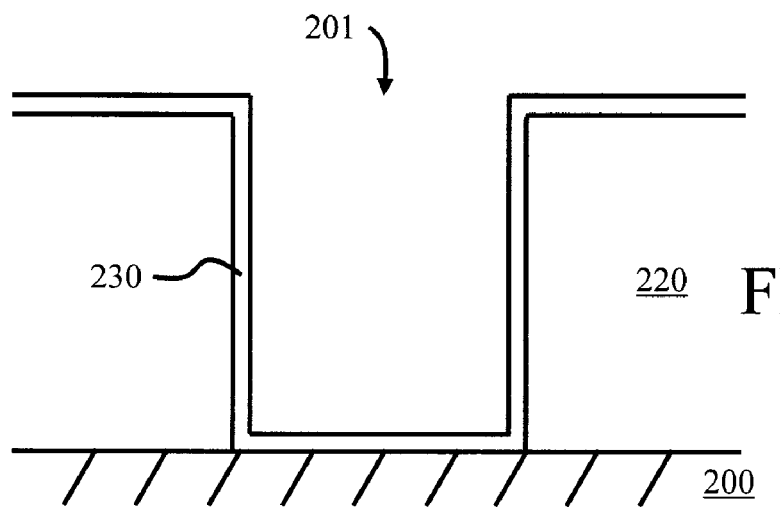

As shown in FIG. 2B, diffusion barrier layer 230 lines high aspect ratio via 201/a top surface of dielectric layer 220. Diffusion barrier layer 230 can comprise any suitable diffusion barrier material, including, but not limited to, tantalum nitride (TaN), or other metal nitride, oxide, sulfide, boride or phosphide, and can be deposited in high aspect ratio via 201/over a top surface of dielectric layer 220 using any suitable deposition process, such as CVD, ALD or sputtering, to a thickness of from about 0.5 nm to about 10 nm.

Figure 1A:
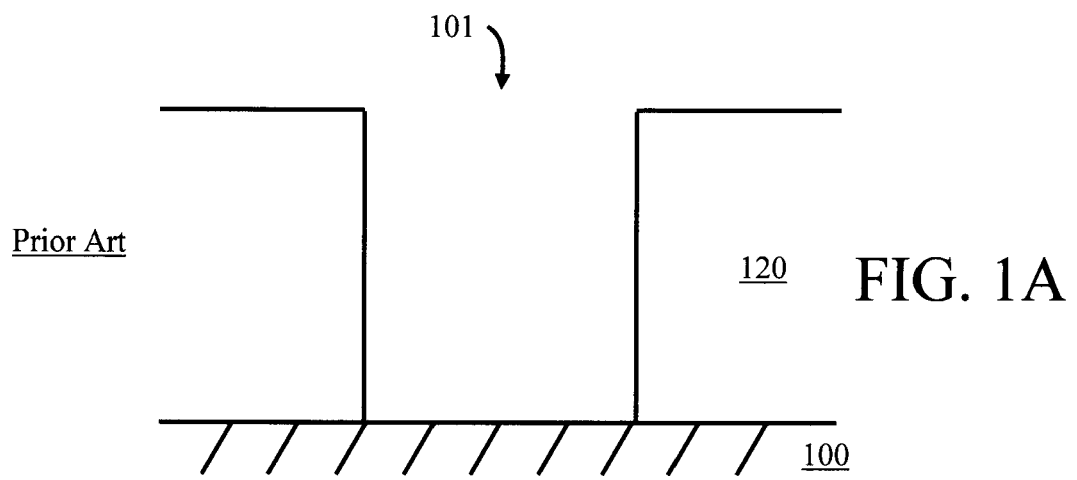
FIGS. 1A-C are cross-sectional diagrams illustrating a conventional via fabrication process.
Figure 1B:
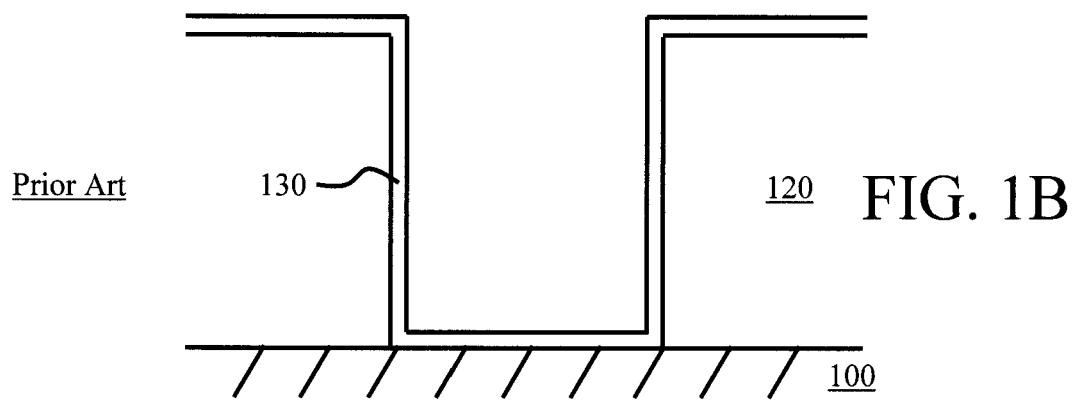
Figure 1C:
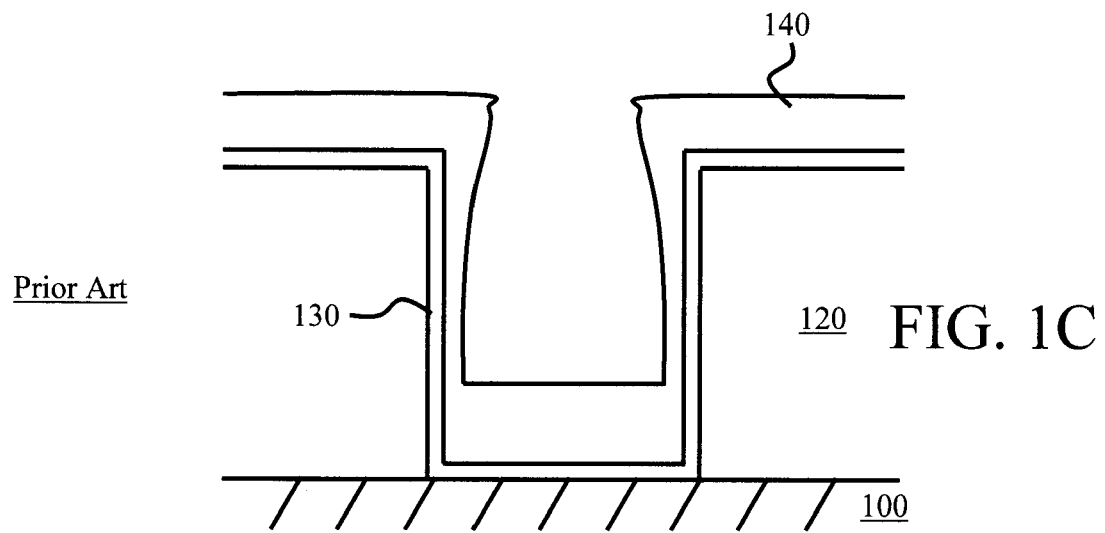
Figure 2C:
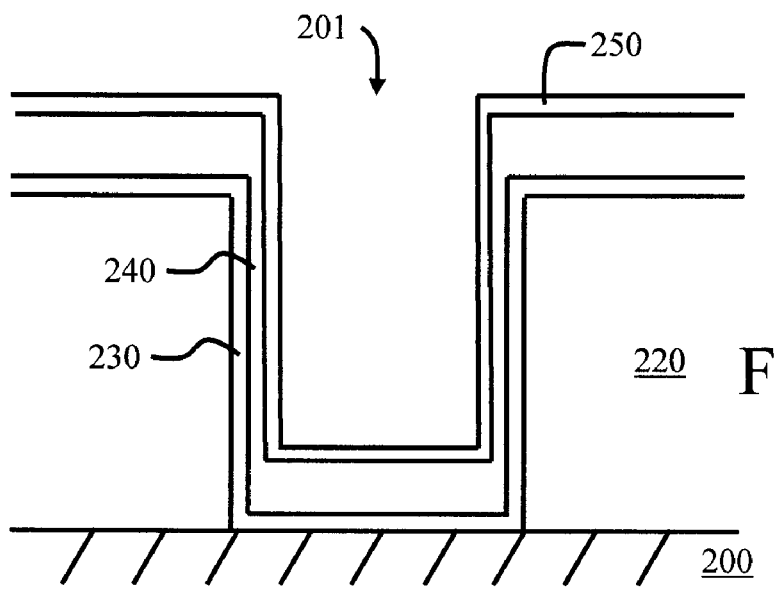

As shown in FIG. 2C, copper (Cu) seed layer 240 is deposited over diffusion barrier layer 230. Cu seed layer 240 can be deposited using any suitable deposition process, such as CVD, ALD or sputtering, to a thickness of from about one nm to about five nm. Cu seed layer 240 is deposited primarily as a current carrying layer during electroplating, and thus (e.g., as compared the process presented in FIGS. 1A-C, described above) does not need to be of a thickness required for continuous coverage on the via sidewalls (i.e., Cu seed layer 240 only needs to be of a thickness required to serve as a current carrying layer during electroplating, see exemplary thicknesses provided immediately above). Therefore, overhang (described above) is not present (preventing occlusion and unfilled voids) which facilitates the extendibility of plating to smaller, higher aspect ratio structures.

Ruthenium (Ru) seed layer 250 is then deposited over Cu seed layer 240. Ru seed layer 250 can be deposited using any suitable deposition process, such as CVD or ALD. According to an exemplary embodiment, Ru seed layer 250 is deposited using CVD, i.e., from a ruthenium carbonyl ($Ru_3(CO)_{12}$) precursor in the presence of excess CO. Advantageously, Ru seed layer 250 formed by this highly conformal process is deposited only to a thickness that ensures a continuous coverage on the via sidewalls, and is therefore within limits set by standard chemical-mechanical polishing (CMP) (see description of FIG. 2D, below). According to an exemplary embodiment, Ru seed layer 250 is deposited to a thickness of less than or equal to about five nm. Ru seed layer 250 over Cu seed layer 240 is also referred to herein as a Ru-on-Cu bilayer.

Figure 2D:
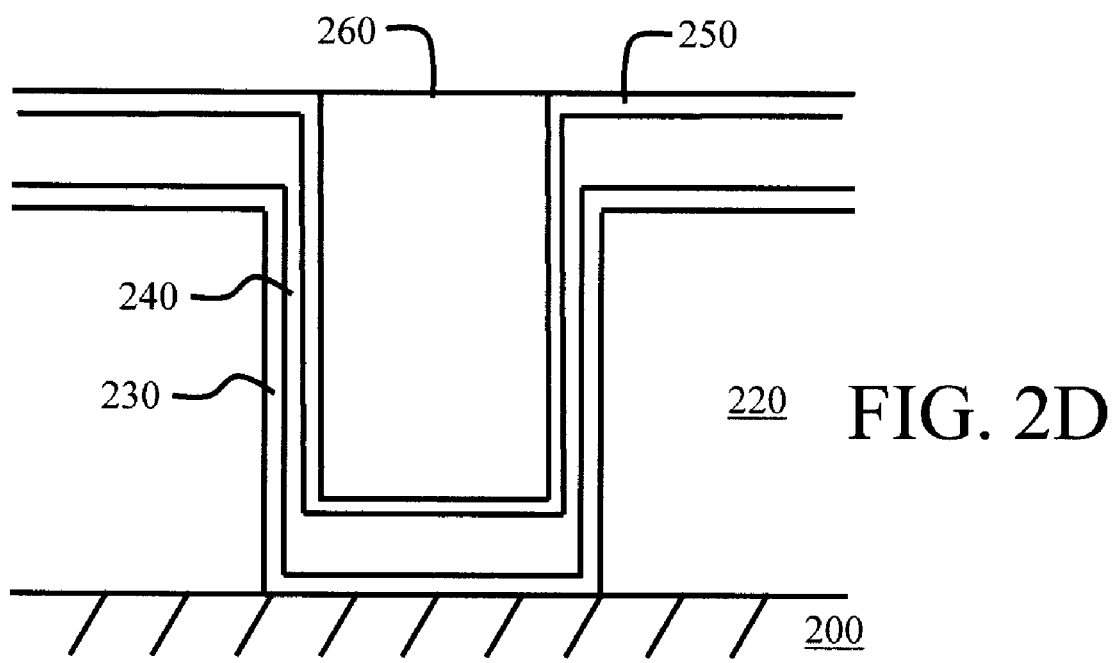

As shown in FIG. 2D, high aspect ratio via 201 is filled with Cu 260, for example, by electroplating Cu 260 onto Ru seed layer 250, to form a Cu plated high aspect ratio via. If desired, CMP can then be used to plane plated Cu 260/Ru seed layer 250/Cu seed layer 240/diffusion barrier layer 230 down to a top surface of dielectric layer 220 (not shown).

One advantage of the present Ru-on-Cu bilayer seed layer configuration (for Cu electroplating, see above) is that Cu plated onto Ru exhibits a superior morphology, for example, as compared to Cu plated on a Cu seed layer. Namely, in the lines, larger grains are observed, and in the via, both larger and oriented columnar grains are found. The larger grains improve conductivity, thus improving performance of the vias.

Prior via fabrication techniques also involving a bilayer seed layer employed a Cu-on-Ru configuration. This Cu-on-Ru configuration, however, has several notable disadvantages over the present Ru-on-Cu bilayer configuration. Namely, the Cu-on-Ru configuration does not provide the morphology advantages associated with Cu plating onto Ru, as described above. Further, with the present Ru-on-Cu bilayer configuration, the Cu component of the bilayer can be made thinner than in a Cu-on-Ru configuration, and still remain viable for plating.

By way of example only, both Ru-on-Cu and Cu-on-Ru seed layers were produced on identical via structures, with one nm of Ru on three nm of Cu and with three nm of Cu on one nm of Ru, respectively. Using identical plating conditions it was found that the Ru-on-Cu sample plated successfully (i.e., uniform plating) while the Cu-on-Ru sample did not. The plating of the Cu-on-Ru sample showed the type of gross non-uniformity associated with insufficient conductivity of a substrate.

The difference in the samples may be due to differing degrees of oxidation that the two seed layers incurred upon exposure to the atmosphere. Ru, a noble metal, is much less susceptible to oxidation than Cu. In the Ru-on-Cu structure the Cu is protected from oxidation by the Ru layer thereover, while in the Cu-on-Ru structure the Cu is directly exposed to the atmosphere. The oxidation of the Cu decreases the conductivity of the Cu-on-Ru seed layer making plating more difficult. It is also possible that significant dissolution of Cu oxide may occur in a plating bath, with similar deleterious consequences for the substrate conductivity.

Another advantage of the Ru-on-Cu bilayer configuration is that, when diffusion barrier layer 230 comprises TaN (see above), a Cu/TaN interface results (i.e., between the Ru-on-Cu bilayer seed layer and the diffusion barrier layer). The Cu/TaN interface has been extensively tested and routinely employed in conventional systems.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating a copper plated high aspect ratio via, comprising:
    depositing a dielectric layer on a substrate, wherein the substrate comprises a contact layer of a multilayer wiring array;
    etching a high aspect ratio via in the dielectric layer with a depth to width aspect ratio of greater than 5:1;
    depositing a diffusion barrier layer comprised of boride into the high aspect ratio via and over one or more surfaces of the dielectric layer;
    depositing a copper layer over the diffusion barrier layer as a current carrying layer during electroplating;
    depositing a ruthenium layer over the copper layer, the ruthenium layer having a thickness configured to ensure a continuous coverage on the via sidewalls,
    wherein the ratio of the copper layer to the ruthenium layer is a three to one ratio; and
    filling the high aspect ratio via with copper plated onto the ruthenium layer.

2. The method of claim 1, wherein the copper is uniformly plated onto the ruthenium layer.

3. The method of claim 1, wherein the copper layer is deposited only to a thickness necessary to serve as a current carrying layer during plating to avoid overhang and occlusion of the high aspect ratio via.

4. The method of claim 1, including depositing the dielectric layer over the substrate using a technique selected from the group consisting of chemical vapor deposition, atomic layer deposition, evaporation, sputtering, a solution based technique, and spin-on coating.

5. The method of claim 1, wherein the high aspect ratio via is etched into the dielectric layer using reactive ion etching.

6. The method of claim 1, wherein the diffusion barrier layer is deposited using a technique selected from the group consisting of chemical vapor deposition, atomic layer deposition and sputtering.

7. The method of claim 1, wherein the copper layer is deposited using a technique from the group consisting of chemical vapor deposition, atomic layer deposition and sputtering.

8. The method of claim 1, wherein the ruthenium layer is deposited using chemical vapor deposition from a ruthenium carbonyl precursor.

9. The method of claim 1, wherein the copper is plated by electroplating.

10. The method of claim 1, including planing the plated copper, the ruthenium layer, the copper layer and the diffusion barrier layer down to a top surface of the dielectric layer.

11. A copper plated high aspect ratio via formed in a dielectric layer, comprising:
   a substrate composed of a single wiring array;
   a dielectric layer comprising an organic polymer;
   an etched area in the dielectric layer with a depth to width aspect ratio of greater than 5:1;
   a diffusion barrier layer comprised of boride lining the etched area and one or more surfaces of the dielectric layer;
   a copper layer over the diffusion barrier layer;
   a ruthenium layer over the copper layer, the ruthenium layer having a thickness configured to ensure a continuous coverage on sidewalls of the via, wherein the ratio of the copper layer to the ruthenium layer is a three to one ratio; and
   copper plated onto the ruthenium layer filling the etched area to form the copper plated high aspect ratio via.

12. The copper plated high aspect ratio via of claim 11, wherein the dielectric layer has a thickness of from about 10 nanometers to about 1,000 nanometers.

13. The copper plated high aspect ratio via of claim 11, wherein the diffusion barrier layer has a thickness of from about 0.5 nanometers to about 10 nanometers.

14. The copper plated high aspect ratio via of claim 11, wherein the copper layer has a thickness of from about one nanometer to about five nanometers.

15. The copper plated high aspect ratio via of claim 11, wherein the ruthenium layer has a thickness of less than or equal to about five nanometers.

* * * * *